United States Patent [19]

Wanlass

[11] 4,425,516

[45] Jan. 10, 1984

[54] BUFFER CIRCUIT AND INTEGRATED SEMICONDUCTOR CIRCUIT STRUCTURE FORMED OF BIPOLAR AND CMOS TRANSISTOR ELEMENTS

[75] Inventor: Frank M. Wanlass, Cupertino, Calif.

[73] Assignee: ZYTREX Corporation, Sunnyvale, Calif.

[21] Appl. No.: 259,651

[22] Filed: May 1, 1981

[51] Int. Cl.³ .................... H03K 17/04; H03K 17/62; H03K 17/693; H03K 19/092

[52] U.S. Cl. .................................. 307/446; 307/475; 307/570

[58] Field of Search ............... 307/443, 446, 451, 475, 307/499, 570, 579, 580, 303, DIG. 1

[56] References Cited

U.S. PATENT DOCUMENTS

| | | | |
|---|---|---|---|
| 3,601,630 | 8/1971 | Redwine | 307/303 X |
| 3,631,528 | 12/1971 | Green | 307/570 |
| 3,649,843 | 3/1972 | Redwine et al. | 307/304 X |
| 4,128,775 | 12/1978 | Frederiksen et al. | 307/475 |

Primary Examiner—Larry N. Anagnos
Assistant Examiner—David R. Hudspeth
Attorney, Agent, or Firm—Flehr, Hohbach, Test, Albritton & Herbert

[57] ABSTRACT

A monolithic integrated circuit structure consisting of interconnected bipolar and CMOS transistor elements forming a buffer circuit. A pair of NPN bipolar transistor elements are interconnected with a pair of N-type MOS transistor elements to form a push-pull output stage providing complementary outputs at the emitters of the bipolar transistor elements. Each of the pair of NPN bipolar transistor elements is arranged in an emitter follower circuit configuration having the conducting channel of one of the pair of N-type MOS transistor elements serially connected to its emitter. The gate electrode of each of the pair of MOS transistor elements respectively is connected to the emitter of the bipolar transistor element to which the conducting channel of the other of the pair of MOS transistor elements is connected. P-type and N-type MOS transistor elements are serially interconnected in a complementary symmetry manner to form an inverter circuit configuration. The complementary interconnected MOS transistor elements have their drains connected together to the base of one of the pair of bipolar transistor elements and their gate electrodes connected together to the base of the other of the pair of bipolar transistor elements, the connected gate electrodes and base forming the buffer circuit input. The collectors of the bipolar transistor elements and the source of the P-type MOS transistor element are connected together to define a positive supply voltage terminal and the sources of the N-type MOS transistor elements are connected together to define a reference potential terminal.

14 Claims, 3 Drawing Figures

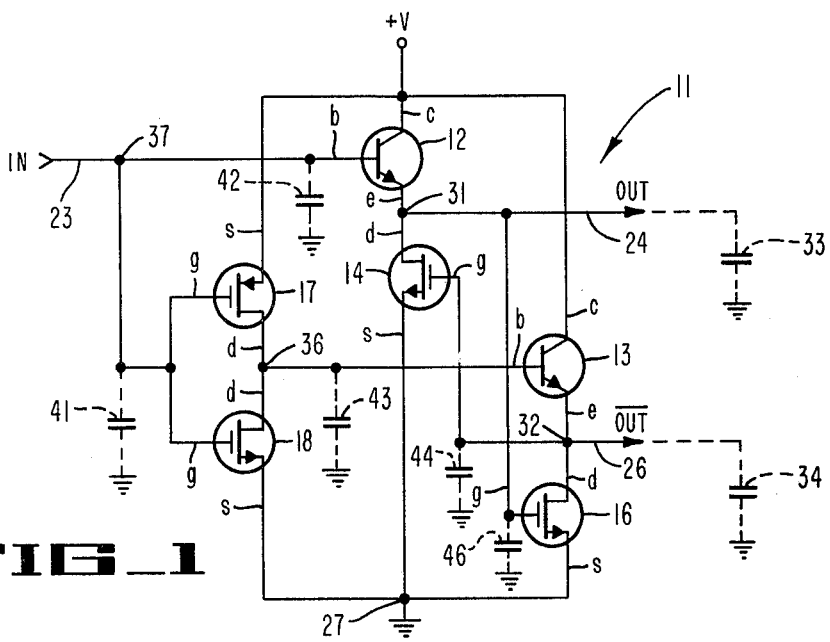
FIG_1
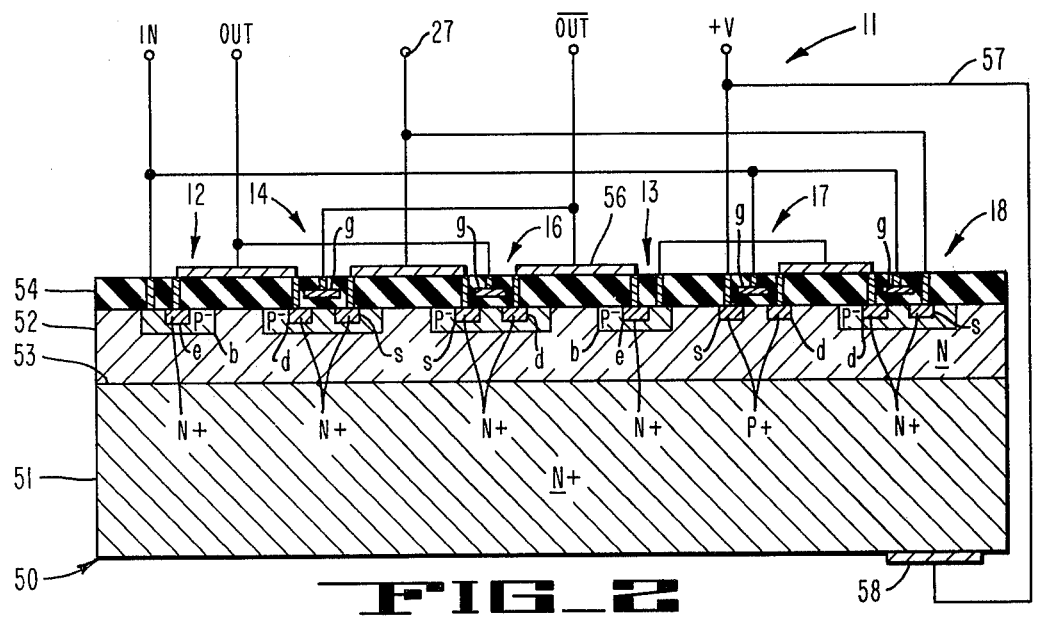
FIG_2
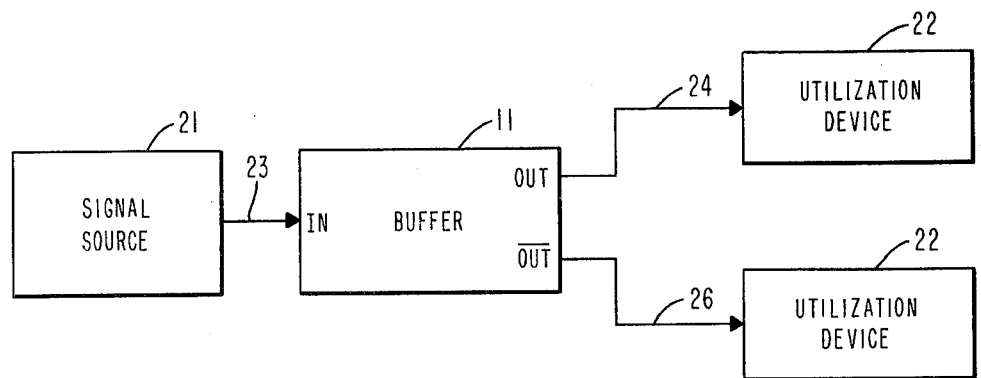
FIG_3

BUFFER CIRCUIT AND INTEGRATED SEMICONDUCTOR CIRCUIT STRUCTURE FORMED OF BIPOLAR AND CMOS TRANSISTOR ELEMENTS

The present invention relates in general to electronic circuits formed by a combination of bipolar and field-effect transistor devices and, more particularly, to a buffer circuit formed of bipolar and complementary field-effect transistor devices suited for monolithic integrated construction within a semiconductor body.

Field-effect transistors (FET's) are widely used in integrated circuits (IC's) as switches forming two-state logic devices. A FET is a device in which the conductance of a conducting channel between two electrodes, the source and the drain, is controlled by a signal applied to a third electrode, the gate. The small size of minimum area FET's relative to bipolar transistor devices, and their self-isolating characteristic has made them particularly attractive for use in constructing densely packed electronic circuits, such as large scale integration (LSI) monolithic structures having several thousand circuit devices formed on a single semiconductor body or "chip".

The metal-oxide-semiconductor (MOS) type of FET is one of the more widely used FET's. Like all FET's, the conducting channel of the MOSFET device has a relatively high resistance for a given channel width when biased in the "on" state. This means that, if a large load is to be driven, the MOSFET device will be so large that a large parasitic input capacitance will exist between the gate and channel separated by a thin metal oxide electrical insulating layer. This characteristic limits the operating speed of MOSFET devices and the speed limitation is compounded when one MOSFET device is coupled to drive many other MOSFET devices, which is typical in MOSFET monolithic IC structures. For example, fairly small N-type MOS devices (NMOS) fabricated by modern day silicon gate processes have conducting channel "on" resistances on the order of 1 kilohm, while fairly small P-type MOS devices (PMOS) fabricated by such processes have conducting channel "on" resistances on the order of 2 kilohms. In electronic circuits formed of interconnected MOS devices, the "on" conducting channel resistance of each driving MOS device limits how fast it can charge or discharge the load capacitance made up of the input capacitance of the following driven MOS device or devices and interconnecting wiring capacitance. A load capacitance of 5 picofarads might often be seen. From the foregoing, it can be seen that for such load capacitance charge and discharge paths, common MOS circuits would have time constants of many nanoseconds (nsec).

Often, NMOS and PMOS devices are combined to form complementary MOS (CMOS) negative logic circuits, such as NAND and NOR logic gates, that consume negligible power (attributed to leakage current) during non-switching, steady-state operating conditions and that can be constructed without power consuming passive circuit elements, such as resistors and the like. My U.S. Pat. No. 3,356,858 describes such NAND and NOR logic gates. As can be seen by reference to my aforesaid patent, such CMOS logic gates are in the form of a network of series and parallel connected NMOS and PMOS devices arranged to control the logic determining voltage level at a common output node in accordance with the logic determining voltage levels present a plurality of input nodes. The low power consumption of such CMOS logic gates makes MOSFET devices even more attractive for use in fabricating densely packed logic circuits. However, the aforementioned poor time constant characteristic of MOS devices results in a slow switching response time performance in logic gates formed of interconnected CMOS devices. A gate delay (i.e., the time interval required for a logic state change at the output of one gate to propagate to the output of the following gate) of up to 100 nsec per gate is common in CMOS logic circuits. Consequently, where high operating speeds are required and such gate delays are intolerable, either bipolar transistor devices are substituted for the MOSFET devices or special buffer circuits are utilized to circumvent the poor switching response time performance of the MOSFET devices.

Various buffer circuits for enhancing the operating speed and drive capability of FET devices forming logic gates, such as disclosed in my aforementioned patent, are described in U.S. Pat. Nos. 3,541,353; 3,609,479; and 3,649,843. As will become more apparent upon consideration of the following description of the buffer circuit of the present invention, none of the buffer circuits described in those patents include all of the advantageous features characterizing the buffer circuit of the present invention. For example, the buffer circuit described in U.S. Pat. No. 3,541,353 is constructed exclusively of one or more bipolar transistor pairs arranged to provide a single-ended output, with each pair consisting of complementary NPN and PNP bipolar transistors. The use of complementary bipolar transistors in monolithic IC structures greatly complicates the fabrication of such structures. In particular, it is very hard to fabricate a high frequency PNP transistor. In the preferred form of the buffer circuit, four relatively large bipolar transistors are employed to achieve the desired buffering between FET logic gates. Furthermore, the bipolar transistors are driven exclusively by the logic gate FET devices coupled to the input of the buffer to effect the charging and discharging of the capacitive load formed by the logic gate devices coupled to the output of the buffer. This places an undesirable load on the driving FET logic gate.

With respect to the buffers described in U.S. Pat. No. 3,609,479, they are formed of interconnected MOS and bipolar transistor devices arranged to provide a single-ended output. This buffer circuit also is driven exclusively by the logic gate FET devices coupled to a buffer circuit's input to effect the charging and discharging of the capacitive load formed by logic gate FET devices coupled to the output of the buffer. As discussed hereinbefore with reference to the buffer circuit described in U.S. Pat. No. 3,541,353, such driving requirement places an undesirable load on the FET logic gate connected to the input of the buffer circuit.

With reference to the buffer circuit described in U.S. Pat. No. 3,649,843, it is formed of interconnected MOS and bipolar transistor devices arranged to provide a single-ended output. All MOS devices are of a single type, P-type being used in the particular embodiment illustrated in the drawings. The buffer circuit draws power during steady-state, i.e., non-switching operating conditions and requires a passive capacitive circuit element and two supply voltages for its operation. The logic gate FET devices coupled to the input of this buffer circuit also provide the entire drive to the buffer circuit to effect the charging and discharging of the capacitive load formed by the logic gate FET devices coupled to the output of the buffer.

In accordance with the present invention, a particular combination of complementary FET (CFET) transistor devices and bipolar transistor devices are interconnected in a particular manner to form a buffer circuit for interfacing a signal source and a signal utilization device or load. The particular interconnection and combination of CFET and bipolar transistor devices results in a buffer circuit having a low input capacitance, low output impedance and short signal delay from input to output that provides a high capacitive load drive capability without loading-down the signal source coupled to the input of the buffer circuit. More specifically, the buffer circuit includes at least one pair of bipolar transistor devices interconnected with at least one pair of FET transistor devices in a push-pull circuit configuration. Each of the pair of bipolar transistor devices is connected in an emitter follower circuit configuration. One of the pair of FET transistor devices has its conducting channel between its source and drain connected in circuit with the emitter of one of the pair of bipolar transistor devices and its gate connected in circuit with the emitter of the other of the pair of bipolar transistor devices so that the connected FET and bipolar transistor devices are in opposite conduction states upon the application of a bias voltage and receipt of a signal at the input to the buffer circuit. The other of the pair of FET and bipolar transistor devices are also connected together in the aforedescribed manner. The buffer circuit further includes at least a pair of CFET transistor devices operatively associated with each push-pull circuit. The CFET transistor devices have their respective conducting channels between their respective sources and drain serially connected together so that the CFET transistor devices are in opposite conduction states upon the application of a bias voltage and define a current path extending to a common node formed at the junction of the conducting channels. The common node is connected to the base of one of the pair of bipolar transistor devices of the operatively associated push-pull circuit while the gates of the pair of CFET transistor devices are together connected to the base of the other of that pair of bipolar transistor devices. To interface electronic circuit devices, the interconnected gates of the CFET and base of the bipolar transistor devices form an input to the buffer circuit for coupling to the output of the signal source that is to provide a signal to the utilization device or load. The emitter of at least one of the pair of bipolar transistor devices forms an output for coupling the signal provided by the signal utilization device or load.

One of the salient features of the buffer circuit of the present invention is that complementary outputs are available from it. The bipolar transistor device having its base connected to form the input of the buffer circuit provides at its emitter a non-inverted form of the signal at the input while the other bipolar transistor device provides at its emitter an inverted or complementary form of the input signal. Therefore, the buffer circuit of the present invention can be employed to perform an ancillary signal inverting function as well as its principal interfacing function. Furthermore, in circuit applications where complementary forms of a particular signal are required, a single buffer circuit can be used to interface a single signal source with two signal utilization devices respectively requiring different ones of the complementary signal forms.

As will be described in detail hereinafter with reference to the drawings, the input capacitance of the buffer circuit of the present invention is formed by the parasitic capacitances across the inputs of the bipolar and CFET transistor devices connected together to form the input of the buffer circuit. The parasitic input capacitance formed at the base of a minimum size bipolar transistor device in an emitter follower circuit configuration is quite small, particularly, relative to the parasitic capacitance formed at the gate of an FET transistor device with the same current output capability. The circuit arrangement of the bipolar transistor devices provide the further advantage of permitting the size of the CFET transistor devices, hence, the input capacitances at their respective gates to be reduced. The small parasitic capacitive load at the base input of the bipolar transistor device connected to the common node formed at the junction of the conducting channels of the CFET devices permits realization of that advantage because it presents a small capacitive load to the CFET devices.

The small input capacitance of the buffer circuit co-operates with the enhanced capacitive load driving capability of the push-pull circuit formed by the pairs of bipolar and FET transistor devices to provide very fast switching response time. The low output impedance characterizing a bipolar transistor device arranged in an emitter follower circuit configuration permits rapid driving of capacitive loads connected to the output of the buffer circuit. Each of the pair of FET transistor devices having its channel connected to one of the pair of bipolar transistor devices serves to drive loads connected to the output of the buffer circuit in the direction opposite that driven by the connected bipolar transistor device. These FET transistor devices can be made large enough to have a low "on" conducting channel resistance, for example, 100 ohms or less, without concern over the concomitant large parasitic gate capacitance, because these FET devices are not driven by, hence, do not load, the signal source connected to the input of the buffer circuit. Consequently, the low driving impedances of the bipolar and FET transistor devices permit the buffer circuit to drive capacitive loads rapidly in both directions without loading down the signal source connected to the input of the buffer circuit.

The buffer circuit of the present invention is characterized by advantages making it especially suited for interfacing between CMOS type FET logic gates and large load capacitances. For example, the speed of a logic circuit formed of many interconnected CMOS logic gates is enhanced considerably by placing the buffer circuit of the present invention between coupled logic gates. As discussed hereinbefore, CMOS transistor devices are characterized by relatively large parasitic gate and wiring capacitances and "on" conducting channel resistances that limit how fast one MOS transistor device can charge or discharge the parasitic gate capacitance of a following MOS transistor device to which it is connected. The slow charge and discharge times are the principal cause of the long gate delays in logic circuits formed of directly connected CMOS logic gates. Using the buffer circuit of the present invention as an interface between CMOS logic gates results in a substantial reduction in the gate delay of the interfaced logic gates because of the low input capacitance and capacitive load driving capability of the buffer circuit.

Typically, CMOS logic gates include a plurality of NMOS and PMOS transistor devices arranged so that no passive circuit elements are needed and no power is consumed during steady-state operating conditions, other than that due to leakage current. By the appropriate selection of the conductivity types of the bipolar and CMOS transistor devices forming the buffer circuit relative to those forming the CMOS logic gates being interfaced, the use of passive circuit elements in the combined buffer and logic gate circuits can be avoided and the power consumption of such interfaced circuits limited to switching intervals and that due to leakage current. Futhermore, selecting a single conductivity type for the bipolar transistor devices and arranging the devices in the buffer circuit in a common collector circuit configuration greatly facilitates fabricating the buffer circuit as a monolithic IC structure. As will be described in greater detail hereinbelow with reference to the drawings, such bipolar transistor devices need not have their collectors isolated and can be conveniently fabricated with the same diffusions as make the CMOS transistor devices.

The foregoing and other features and advantages of the buffer circuit of the present invention will become more apparent upon consideration of the following more detailed description of preferred embodiments of the invention and appended claims taken together with the accompanying drawings in which:

FIG. 1 is a schematic diagram of one preferred embodiment of the buffer circuit of the present invention;

FIG. 2 is a diagrammatic sectional view of an embodiment of the buffer circuit having its transistor elements fabricated as a monolithic IC structure; and FIG. 3 is a schematic block diagram exemplifying one use of the buffer circuit of the present invention.

FIGS. 1 and 2 together illustrate one preferred embodiment of the buffer circuit of the present invention, indicated generally by the reference number 11, including NPN-type bipolar transistor elements 12 and 13 and complementary MOS-type FET transistor elements 14, 16, 17 and 18 fabricated as a monolithic IC structure. As discussed hereinbefore, constructing the buffer circuit 11 from such transistor elements makes the circuit particularly suited for use as an interface between CMOS logic gates, especially when the circuit and gates are fabricated as a monolithic integrated structure on a single semiconductor chip. However, features and advantages of the buffer circuit 11 also can be realized in constructions including other types of FET transistor elements and also make the circuit attractive for use as an interface between circuits other than CMOS logic gates. Generally, and with reference to FIG. 3, the buffer circuit 11 will find advantageous use in applications where it is desired to protect a signal source 21 against undesirable loading by signal utilization devices 22. While the monolithic integrated structure form of construction of the buffer circuit 11 is preferred for applications where high speed switching and high component packing density are important, the buffer circuit also can be constructed using discrete bipolar and FET transistor devices. Furthermore, the buffer circuit 11 also can be constructed using bipolar and FET transistor elements of conductivity types that are the complement of those forming the particular buffer circuit embodiment illustrated in FIGS. 1 and 2. However, the NPN-type bipolar transistor element is preferred over the PNP-type for high speed switching circuits because of the superior high-frequency response of the NPN-type.

The electronic circuit features of the buffer circuit 11 of the present invention will first be described in detail with reference to FIGS. 1 and 3. Such features will be described in connection with the use of the buffer circuit 11 as an interface between a signal source 21 and signal utilization devices 22 (see FIG. 3) in the form of CMOS negative logic gate circuits. The signal source 21 may, for example, be a CMOS-type NAND gate or a CMOS-type NOR gate of the kinds illustrated and described in my aforementioned U.S. Pat. No. 3,356,858. In the NAND gate, logical high level signal state is generated at its output when at least one of its inputs is a logical low level signal state. When logical low level signal states are simultaneously present at all inputs to the NAND gate, a logical low level signal state is generated at the NAND gate's output. In the NOR gate, a logical high level signal state is generated at its output when logical low level signal states are simultaneously present at all of its inputs. All other combinations of input logical signal states produce a logical low level signal state at the output of the NOR gate. Whichever type logic gate forms the signal source 21, its output is extended by a conductive lead 23 to the input terminal, labeled "IN", of the buffer circuit 21.

As described hereinbefore, the buffer circuit 11 has the capability of providing at its output complementary forms of the signal present at its input. Therefore, a pair of signal utilization devices 22 may be coupled to receive the complementary signal outputs provided by the buffer circuit 11. Such devices may, for example, be a pair of multiple input CMOS-type NAND gates briefly described above, or a pair of multiple input CMOS-type NOR gates also briefly described above, or one of each. In either of the cases, the true signal output terminal, labeled "OUT", is extended by a conductive lead 24 to one of the multiple inputs of the logic gate forming one of the signal utilization devices 22 (or to one input of each of several logic gates, if more than one signal utilization device is to receive the signal output provided at the OUT terminal). The complementary signal output terminal, labeled "$\overline{\text{OUT}}$", is extended by a conductive lead 26 to one of the multiple inputs of the logic gate or logic gates forming the other one or set of the signal utilization devices 22.

Referring now to the details of the embodiment of the buffer circuit 11 illustrated in FIG. 1, the pair of NPN bipolar transistor elements 12 and 13 are interconnected with the pair of NMOS transistor elements 14 and 16 to form a dual-input, dual-complementary-output push-pull stage having no power consuming passive circuit elements, other than unavoidable parasitics. Each of the NPN bipolar transistor elements 12 and 13 is connected in a common collector, emitter follower circuit configuration having its base, b, coupled to be responsive to the signal received at the IN terminal and its collector, c, connected to the terminal labeled "+V" provided for connection to the positive side of a voltage supply, selected to establish the desired reverse bias of the base-to-collector junction and the desired forward bias of the base-to-emitter junction. The emitter, e, of the bipolar transistor element 12 is coupled in circuit with the conducting channel of the NMOS transistor element 14, which forms a switch between the emitter and a ground reference potential established at the ground terminal 27. The emitter, e, of the bipolar transistor element 13 is coupled in circuit with the conducting channel of the NMOS transistor element 16, which forms a switch between the emitter and ground reference potential established at ground terminal 27.

Each of the NMOS transistor elements 14 and 16 has a source, s, and drain, d, between which a conducting channel extends whose conductance is controlled by a voltage applied to a gate, g. The NMOS transistor element 14 has its source, s, connected to the ground terminal 27, its drain, d, connected to the emitter, e, of the bipolar transistor element 12 and its gate, g, connected to the emitter, e, of the other bipolar transistor element 13. The other NMOS transistor element 16 has its source, s, connected to ground terminal 27; its drain, d, connected to the emitter, e, of the bipolar transistor element 13; and its gate, g, connected to the emitter, e, of the other bipolar transistor element 12. As will be explained further hereinafter, the two bipolar transistor elements 12 and 13 are maintained in opposite steady-state conduction states by the application to their respective bases, b, of complementary forms of the input signal received at the IN terminal of the buffer circuit 11 over conductive lead 23. By coupling the conducting channel of each of the two NMOS transistor elements 14 and 16, respectively, in series with this emitter, e, of one of the two bipolar transistor elements and connecting its gate, g, to the emitter, e, of the other of the two bipolar transistor elements, each of the two NMOS transistor elements 14 and 16 will be maintained in a steady-state conduction state that is opposite that of the bipolar transistor element whose emitter, e, is connected in series with the conducting channel of the NMOS transistor element. Consequently, the serially connected bipolar and NMOS transistor elements 12 and 14 are maintained in opposite conduction states, as are the serially connected bipolar and NMOS transistor elements 13 and 16, and no steady-state current conduction paths are formed between the +V terminal and the ground terminal 27. The only time the serially connected bipolar and NMOS transistor elements are simultaneously in the "on" conducting state is during the short interval when they are simultaneously switched from one steady-state conduction state to the other. Therefore, the push-pull stage of the buffer circuit 11 consumes minimum power.

The buffer circuit 11 provides a pair of complementary outputs labeled OUT and $\overline{\text{OUT}}$. The true OUT terminal is at the common node 31 defined by the junction of the emitter, e, of the bipolar transistor element 12 and of the drain, d, of the NMOS transistor element 14. The complementary $\overline{\text{OUT}}$ terminal is at the common node 32 defined by the junction of the emitter, e, of the bipolar transistor elenent 13 and of the drain, d, of the NMOS transistor element 16. The complementary outputs at the common nodes 31 and 32 are coupled to signal utilization devices, or loads, by the conductive leads 24 and 26, respectively. In applications where the buffer circuit 11 is employed to interface CMOS logic gates, the load presented to the buffer circuit 11 is formed by the inputs of MOS transistor elements of the one or more CMOS logic gates. This load is capacitive, resulting from the presence of the parasitic gate-to-conducting channel capacitances of the MOS transistor elements and from the parasitic wiring capacitance of the connecting conductive lead extending from a common node of the buffer circuit to the gates of the MOS transistor elements. The parasitic load capacitances presented to the complementary outputs provided by the buffer circuit 11 are represented in FIG. 1 by the capacitor elements 33 and 34.

In operation, current is conducted from the voltage supply connected to the +V terminal to charge the parasitic capacitor 33 when the bipolar transistor element 12 is in the "on" steady-state conducting state and the NMOS transistor element 14 is in the "off" steady-state conducting state. When the bipolar transistor element 12 is in the "off" steady-state conducting state and the NMOS transistor element 14 is in the "on" steady-state conducting state, current is conducted by the NMOS transistor element from the parasitic capacitor 33 to ground, thereby discharging the capacitor 33. The other bipolar and NMOS transistor elements 13 and 16 similarly cooperate to charge and discharge the parasitic capacitor 34, except that they are in complementary steady-state conducting states to charge the parasitic capacitor 34 while the parasitic capacitor 33 is discharged and to discharge the parasitic capacitor 34 while the parasitic capacitor 33 is charged.

The conducting states of the elements forming the push-pull stage of the buffer circuit is controlled by the signal at the IN terminal of the buffer circuit in cooperation with an inverter stage formed by the CMOS transistor elements 17 and 18. The inverter stage includes a PMOS transistor element 17 having its source, s, connected to the +V terminal and NMOS transistor element 18 having its source, s, connected to the ground terminal 27. The drains, d, of the CMOS transistor elements 17 and 18 are connected together to form a common node 36 that is connected to the base, b, of one of the two bipolar transistor elements, namely, element 13, forming the push-pull stage of the buffer circuit 11. The gates, g, of the CMOS transistor elements 17 and 18 are connected together at the junction 37, to define the IN terminal of the buffer circuit 11. With the gates of the CMOS transistor elements 17 and 18 connected together in this manner, a signal present at the IN terminal will bias one of the CMOS transistor elements to the "off" conducting state while simultaneously biasing the other to the "on" conducting state. A logical high (positive in the illustrated embodiment) signal voltage level exceeding the threshold voltage level (i.e., the voltage level required to place the MOSFET in the "on" conducting state) of the NMOS transistor element 18, places the NMOS transistor element 18 in the "on" conducting state while simultaneously placing the PMOS transistor element 17 in the "off" conducting state. Placing the NMOS transistor element 18 in the "on" conducting state places the common node 36 at the potential of the ground terminal 27, which is the complement of the high signal voltage level present at the IN terminal. A logical low or ground potential signal voltage level exceeds the threshold voltage level of the PMOS transistor element 17 and, when present at the IN terminal of the buffer circuit 11, places the PMOS transistor element 17 in the "on" conducting state while simultaneously placing the NMOS transistor element 18 in the "off" conducting state. This places the common node 36 close to the potential of the +V terminal, which is the complement of the low signal voltage level present at the IN terminal.

The junction 37 or IN terminal of the buffer circuit 11 is also directly connected to the base, b, of the bipolar transistor element 12. With the bipolar and CMOS transistor elements 12, 13, 17 and 18 arranged in the foregoing manner, the bases, b, of the two bipolar transistor elements 12 and 13 receive complementary forms of the signal coupled to the IN terminal by conductive lead 23. As a result, the bipolar transistor elements will assume opposite conducting states in response to the logical signal state level established at the IN terminal and both will simultaneously change conducting states in response to a change in the logical signal state level at the IN terminal.

The operation of the buffer circuit 11 will now be described for the case when the steady-state logical signal state level initially present at the IN terminal is high, then changes to a steady-state logical low level and eventually changes back to a steady-state logical high level. With a steady-state logical high level signal state present at the IN terminal, the NMOS transistor element 18 is biased to the steady-state "on" conducting state, while the PMOS transistor element 17 is biased "off". This couples the logical low level ground potential established at the ground terminal 27 to the common node 36, hence, base, b, of the bipolar transistor element 13, which biases the bipolar transistor element "off". However, since the base, b, of the bipolar transistor element 12 is directly connected to the IN terminal, it is biased "on" by the steady-state logical high level signal state present at the IN terminal. With the bipolar transistor element 12 in the "on" conducting state, the parasitic capacitor 33 of the load coupled to the true OUT terminal is charged to a logical high level close to the positive potential at the +V terminal (within one base-emitter forward drop) by current conducted from the voltage supply connected to the +V terminal via the common node 31 forming the OUT terminal and the conductive lead 24. In addition, the "on" bipolar transistor element 12 places the common node 31 at the logical high level positive potential (less a small base-emitter voltage drop across the bipolar transistor element 12) established at the +V terminal by the voltage supply. As a result, the NMOS transistor element 16 having its gate, g, connected to the common node 31 is biased to the "on" conducting state. With the NMOS transistor element 16 in the "on" conducting state and the bipolar transistor element 13 biased "off" by the complementary logical low level signal state present at the common node 36 output of the inverter stage, the common node 32 forming the $\overline{\text{OUT}}$ terminal is coupled to the logical low level ground potential at the ground terminal 27 via the conducting channel of the NMOS transistor element 16. As a result, the parasitic capacitor 34 of the load is discharged to the logical low level via the conductive lead 26, common node 32, conducting channel of the NMOS transistor element 16 and the ground terminal 27. Placing the common node 32 at ground potential also places the gate, g, of the NMOS transistor element 14 at ground potential, which biases the element 14 "off". As can be appreciated from the foregoing, the presence of a steady-state logical high level signal state at the IN terminal of the buffer circuit 11 results in the generation of a corresponding steady-state logical high level signal state at the OUT terminal of the buffer circuit and a complementary steady-state logical low level signal state at the $\overline{\text{OUT}}$ terminal. In addition, other than due to low level leakage current, no power is drawn by the buffer circuit 11 in this steady-state operating condition because one of the transistor elements in each of the branches extending between the +V terminal and ground terminal 27, namely, bipolar, NMOS and PMOS transistor elements 13, 14 and 17, respectively, is in the "off" conducting state.

When the logical signal state at the IN terminal changes from the high level to a low level, the low level signal present at the base, b, of the bipolar transistor element 12 immediately places that element in the "off" conducting state. At the same time, the other bipolar transistor element 13 is immediately placed in the "on" conducting state by the complementary high level signal provided to its base, b, by the inverter stage. A logical low level signal state at the IN terminal of the buffer circuit 11 biases the NMOS transistor element 18 of the inverter stage "off" while biasing the PMOS transistor element 17 of the inverter stage "on". With CMOS transistor elements biased in this manner, the common node 36 output of the inverter stage is coupled by the PMOS transistor element 17 to the logical high level positive potential established at the +V terminal, which biases the bipolar transistor element 13 to the "on" conducting state.

Momentarily after the two bipolar transistor elements 12 and 13 change steady-state conducting states in response to the change in the logical signal state at the IN terminal, each of the NMOS transistor elements remains in the same conduction state as its serially connected bipolar transistor element, i.e., both bipolar and NMOS transistor elements 12 and 14 are "off" and both bipolar and NMOS transistor elements 13 and 16 are "on". During the time this condition obtains, current is drawn through the serially connected bipolar and NMOS transistor elements 13 and 16 from the voltage supply connected between the +V terminal and the ground terminal 27. However, as a result of placing the bipolar transistor element 13 in the "on" conducting state and the bipolar transistor element 12 in the "off" conducting state, the common node 32 is forced towards the logical high level positive potential established at the +V terminal because of the high current gain of the bipolar transistor element 13, even though the NMOS transistor element 16 momentarily remains "on". Since the bipolar transistor element 12 is "off", there is no transistor action holding the common node 31 and parasitic capacitor 33 coupled thereto at the previously established logical high level positive potential. Consequently, since the gate, g, of the NMOS transistor element 14 is coupled to the positively going common node 32, the aforementioned transistor action also drives the NMOS transistor element 14 from the "off" to the "on" conducting state. As the NMOS transistor element 14 is driven into the "on" conducting state, the parasitic capacitor 33 discharges through the conducting channel of the driven NMOS transistor element and thereby drives the other NMOS transistor element 16 into the "off" conducting state. Driving the NMOS transistor element 16 into the "off" conducting state terminates the flow of heavy current from the voltage supply through the bipolar and NMOS transistor elements 13 and 16.

When steady-state operating conditions are reached following the change to the logical low level signal state at the IN terminal, the PMOS transistor element 17 is "on", the NMOS transistor element 18 is "off", the bipolar transistor element 12 is "off" and the serially connected NMOS transistor element 14 is "on", and the bipolar transistor 13 is "on" and the serially connected NMOS transistor element 16 is "off". Under these operating conditions, the parasitic capacitor 33 coupled to the common node 31 defining the OUT terminal is discharged through the "on" NMOS transistor element 14 to the logical low level and the parasitic capacitor 34 coupled to the common node 32 defining the OUT terminal is charged through the "on" bipolar transistor element 13 to the complementary logical high level. The transistor elements and circuit nodes of the buffer circuit 11 remain in the aforedescribed operating states until a logical signal state change occurs at the IN terminal of the buffer circuit.

When the logical signal state at the IN terminal changes from the low level back to the high level, the inverter stage responds as described hereinbefore to place the common node 36, hence, base, b, of the bipolar transistor element 13 at a logical low level ground potential established at the ground terminal 27. The change to the logical high level signal state at the IN terminal is coupled to the base, b, of the bipolar transistor element 12, which responds by changing from "off" to the "on" conducting state, while the other bipolar transistor element 13 is biased from the "on" to the "off" conducting state by the complementary logical low level signal state provided at its base, b, by the inverter stage. As a result of the change in the conducting states of the bipolar transistor elements 12 and 13, the common node 31 is forced towards the logical high level positive potential established at the +V terminal because of the high current gain of the bipolar transistor element 12, even though the NMOS transistor element 14 momentarily remains "on". This transistor action also drives the other NMOS transistor element 16 from the "off" to the "on" conducting state because its gate, g, is coupled to the positive going common node 31 and there is no transistor action holding the coupled together common node 32 and parasitic capacitor 34 at the previously established logical high level positive potential since the bipolar transistor element 13 is "off". As the NMOS transistor element 16 is driven into the "on" conducting state, the parasitic capacitor 34 coupled to its drain, d, at the common node 32 discharges through the conducting channel of the driven NMOS transistor element 16. This action drives the other NMOS transistor element 14 (whose gate, g, is coupled to the parasitic capacitor 34) from the "on" to the "off" conducting state. This terminates the flow of heavy current from the voltage supply through the bipolar and NMOS transistor elements 13 and 16.

Upon reaching the steady-state operating condition, the transistor elements forming the buffer circuit 11 are in conducting states which are the opposite of those specified above for a steady-state operating condition in which a logical low level signal is present at the IN terminal. Also, the common node 31 defining the true OUT terminal of the buffer circuit 11 is once again at (and the parasitic capacitor 33 is once again charged to) a logical high level signal state. At the same time, the common node 32 defining the complementary OUT terminal is once again at (and the parasitic capacitor 34 is once again charged to) a complementary logical low level signal state.

From the foregoing description, it can be appreciated that the buffer circuit 11 provides outputs that are complementary forms of a single input. Therefore, the buffer circuit can be employed to perform the ancillary signal inverting and/or complementary signal generating functions as well as its principal interfacing function. In addition, the manner of driving the NMOS transistor elements 14 and 16 from the output side of the buffer circuit 11 in response to changes in the logical signal state condition at the IN terminal of the buffer circuit 11 avoids loading down the signal source. However, as will become apparent from the following description, the particular interconnection of the various transistor elements forming the buffer circuit 11 enable the construction of a buffer circuit 11 having an extremely short signal delay, namely, only a few nanoseconds, from its IN terminal to its two complementary output terminals, labeled OUT and OUT, respectively. More specifically, the base input capacitance of minimum size bipolar transistor elements are quite small when compared to the gate input capacitance of MOS transistor elements with the same current drive capability. In a preferred embodiment of the buffer circuit of the present invention, the base input capacitance of each of the two bipolar transsitor elements 12 and 13 is minimized by using transistor elements whose base and emitter diffusions are of minimum areas. Furthermore, since the CMOS transistor elements 17 and 18 forming the inverter stage of the buffer circuit are not required to drive large gate input capacitances typifying MOS transistor elements, but are only required to drive the small base input capacitance of the bipolar transistor element 13, the gates, g, of the CMOS transistor elements can be quite small. As will be described in further detail hereinafter with reference to the monolithic IC structure embodiment of the buffer circuit 11 of the present invention, using the known modern silicon-gate CMOS process to fabricate the buffer circuit and appropriately sized diffusion masks permits the construction of a buffer circuit having an extremely small input capacitance determined by the combination of the input gate capacitances of CMOS transistor elements 17 and 18 and of input base capacitance of the bipolar transistor 12. For example, a monolithic IC structure including CMOS transistor elements 17 and 18 having a total input gate capacitance of about 0.05 picofarad, depicted in FIG. 1 by the single capacitor 41, and bipolar transistor elements 12 and 13 each having an input base capacitance of 0.05 picofarad, depicted in FIG. 1 by the capacitors 42 and 43, form a buffer circuit 11 presenting to a signal source 21 (FIG. 1) coupled by the conducting lead 23 to the IN terminal a total input capacitance of only 0.1 picofarad. Assuming the output impedance of the signal source 21 is comparable to that mentioned hereinbefore for typical CMOS logic gates that are constructed to drive capacitive loads, namely 1 to 2 kilohms, the input of the buffer circuit 11 having the above-specified input capacitance will have a response time of less than 1 nsec. To realize the advantages of the buffer circuit of the present invention, it is preferred that the input capacitance of the CMOS transistor elements 17 and 18 be less than about 0.2 picofarads.

Considering the output side of the buffer circuit 11, both the true and complementary outputs at the common nodes 31 and 32 will have quite low output impedances for driving the loads coupled to the nodes by the conductive leads 24 and 26, respectively, in the positive direction. The high current gains provided by the emitter follower circuit configurations of the bipolar transistor elements 12 and 13 are the reason for this. For a bipolar transistor element having a beta of about 100 and a signal source driving impedance of 2 kilohms (which can be obtained from modern CMOS gate circuits), the bipolar transistor elements 12 and 13 define positive going output impedances at the OUT and OUT terminals, respectively, of the buffer circuit 11 of about 20 ohms each. This is such a low driving impedance that it hardly creates a signal delay at all, even when many CMOS logic gates form the loads coupled to the OUT and OUT terminals of the buffer circuit. The positive-going response time into a CMOS logic gate or gates having an input capacitance of up to 5 picofarads is less than 1 nsec.

As described hereinbefore, the outputs at the common nodes 31 and 32 are pulled-down in the negative direction by the operation of the NMOS transistor elements 14 and 16. Since these elements are driven by the low output impedance bipolar transistor elements 12 and 13 when pulling-down the common nodes in the negative direction, they can be made large enough to have a low conducting channel resistance without concern about the concomitant large input gate capacitance, depicted in FIG. 1 by capacitors 44 and 46, respectively. For example, a conducting channel resistance of 100 ohms can be achieved at a concomitant input gate capacitance of about 1 picofarad. With such NMOS transistor elements 14 and 16, the buffer circuit 11 will have a negative-going response time of about 1 nsec when arranged to drive several typical CMOS logic gates coupled to the OUT and OUT terminals. To realize the advantages of the buffer circuit of the present invention, it is preferred that the output impedance of each of the bipolar transistor elements 12 and 13 be less than about 1/5 of the "on" conducting channel resistance of the serially connected NMOS transistor element.

As will be appreciated from the foregoing, placing the buffer circuit 11 of the present invention between one CMOS logic gate and many other driven gates can reduce the gate delay by as much as two orders of magnitude. This feature greatly enhances the operating speed of logic circuits constructed of many interconnected CMOS logic gates.

One possible fabrication sequence of a particular monolithic IC structure 50 embodiment of the buffer circuit 11 will now be be described with reference to FIG. 2. To fabricate the monolithic IC buffer circuit structure 50, a 300 micron thick substrate 51 of silicon, heavily doped with an N-type impurity, such as arsenic or antimony, is subjected to a modern silicon-gate CMOS process including several successive steps of masking, etching, cleaning and selected material deposition. In the masking steps, a photoresistive material is placed over the surface of the semiconductor structure in a selected pattern that leaves selected regions exposed for subsequent processing steps. A suitable solvent is employed to remove and clean the semiconductor structure of the photoresistive material. The various masking, etching and cleaning steps are performed as presently practiced in modern silicon-gate CMOS processes.

The monolithic IC structure 50 can be fabricated to form one or more buffer circuits 11 on a single semiconductor chip, either alone or together with other CMOS gate circuits. However, to facilitate the description of the monolithic IC buffer circuit structure 50 of the present invention, only the fabrication of a single buffer circuit 11 will be described in detail. Those skilled in the art will readily understand from such description how to alter the silicon-gate CMOS process to fabricate a monolithic IC structure including more than one buffer circuit or combinations of buffer circuits and other CMOS gate circuits.

In the fabrication of the monolithic IC structure 50, an epitaxial layer 52 of N-type silicon material is grown uniformly over a surface 53 of the substrate 51 to a thickness of about 5 microns. Following the growth of the epitaxial layer 52, a silicon oxide layer 54 is formed over the entire surface of the epitaxial layer to a depth of about 1 micron. As will be described in further detail hereinafter, the silicon oxide layer 54 is employed to construct the insulating layers of the MOS transistor elements 14, 16, 17 and 18 that separate their respective gates, g, and conducting channels. In addition, while the silicon oxide layer 54 is subjected to several etchings during the fabrication of the monolithic IC structure 50 that remove portions of the layer, silicon oxide is regrown after such etchings to eventually form a protective passivating layer over the fabricated bipolar and MOS transistor elements forming the buffer circuit 11.

After the formation of the silicon oxide layer 54 over the entire surface 53, the surface of the silicon oxide layer 54 is masked to expose only those selected regions of the surface at which the NPN bipolar and NMOS transistor elements are to be formed. with the mask thusly formed, the previously formed 1 micron silicon oxide layer is removed from the selectively exposed regions by etching to expose the underlying epitaxial layer 52. Following this etching the photoresistive mask is removed and the structure cleaned to prepare it for the next processing step.

In the next processing step, boron is implanted at the exposed epitaxial region to form lightly doped P⁻ regions used for both the NPN bipolar and NMOS transistor elements 12, 13 and 14, 16, 18, respectively. These P⁻ regions will form, after diffusion, the bases, b, of the NPN bipolar transistor elements 12 and 13 and the well regions of the NMOS transistor elements 14, 16 and 18. At this point, the typical modern silicon-gate CMOS process is altered in order to obtain bipolar transistor elements with a narrow base width and therefore a high cutoff frequency. The boron implanted regions are subject to a shorter than normal diffusion process that results in the formation of shallow P⁻ well regions for the NMOS transistor elements 14, 16 and 18 that extend into the epitaxial layer 52 to the same shallow depth as the P⁻ regions forming the bases, b, of the NPN bipolar transistor elements 12 and 13. To obtain the response time performance characteristics described above in connection with FIG. 1, the P⁻ regions are diffused to a depth of no more than 2 microns, preferably about 1½ microns. In addition, the bases of the bipolar transistor elements are formed from very small area P⁻ regions occupying a surface area of about 400 square microns to minimize capacitance and enhance the response time of the fabricated buffer circuit 11.

An alternative to using the same P⁻ diffusion to form NMOS transistor element wells and bipolar transistor element bases would be to fabricate the NMOS transistor elements with a typical P⁻ well diffusion depth, and to employ an extra mask step to implant and diffuse the base for the bipolar transistor elements.

Following the implanting and diffusion formation of the well and base regions, the silicon oxide layer is regrown to cover over these regions.

In next step, the silicon oxide covered structure is again masked to expose only those regions at which the bipolar and MOS transistor elements are to be formed and the silicon oxide layer is reduced at the exposed regions by etching to a thickness of about 0.1 micron. A heavily n-doped polysilicon conductive material is deposited over the exposed regions to a depth of about 0.5 microns to form the gates, g, of the MOS transistor elements 14, 16, 17 and 18. By further masking the polysilicon to expose only the portions of the polysilicon regions that are to be removed, the gates, g, of the desired definitive size are defined. The exposed polysilicon material is etched away, leaving behind gates of the desired definitive size. To minimize the input gate capacitances and the "on" conducting channel resistances, the gates, g, of the MOS transistor elements are of a small length, but of sufficient widths transverse to the direction of current flow through the conducting channels to provide the desired minimum resistances. For the buffer circuit 11 described above with reference to FIG. 1, the gates, g, of the NMOS transistor elements 14 and 16 each occupy a surface area of about 600 square microns, each with a dimension of about 4 microns extending parallel to the surface of the structure in the direction of current flow through the conducting channel, and a dimension of about 150 microns extending parallel to the surface of the structure in the width direction transverse to the current flow through the conducting channel. The gate, g, of the NMOS transistor element 18 is approximately 48 square microns, with a dimension of about 4 microns extending parallel to the surface of the structure in the direction of current flow and a dimension of about 12 microns extending transverse to the current flow. The gate, g, of the PMOS transistor element 17 occupies a surface area of about 80 square microns, with a dimension of about 4 microns extending parallel to the surface of the structure in the direction of current flow, and a dimension of about 20 microns extending parallel to the surface of the structure in the width direction transverse to the current flow. The 4 micron dimension of the gates, g, provides the desired minimum input gate capacitances for the MOS transistor elements, while the larger 150, 20, and 12 micron dimensions of the gates, g, provide the desired minimum "on" conducting channel resistances of the MOS transistor elements.

The thin 0.1 micron silicon oxide layer underlying each polysilicon gate layer forms the insulating barrier that separates each gate from the conducting channel of the associated MOS transistor element formed in the epitaxial layer 52 beneath the gate.

After the formation of the gates, g, each of the regions at which either a bipolar or a MOS transistor element is to be formed remains covered by the thin 0.1 micron thick layer of silicon oxide, except for the polysilicon layers that form the gates, g, at the MOS transistor element locations. The entire structure is then masked to leave the thin 0.1 micron layer of silicon oxide exposed only at the regions at which P-type impurities are to be added to form the drain, d, and source, s, of the PMOS transistor element 17. Boron P-type material is then implanted through the exposed thin silicon oxide layer and diffused into the epitaxial layer 52 to a depth of about 1 micron to form heavily doped P+ regions that define the drain, d, and source, s, of the PMOS transistor element 17. Following this implantation and diffusion, the photoresistive mask is removed and the structure cleaned to prepare it for the next processing step.

In the next processing step, the structure is again masked to leave only the thin 0.1 micron layers of silicon oxide exposed at the locations where the drains, d, and sources, s, of the NMOS transistor elements 14, 16 and 18 and the emitters, e, of the NPN bipolar transistor elements 12 and 13 are to be formed. To form those drains, sources and emitters, phosphorus N-type material is implanted through the exposed thin silicon oxide layer and diffused into the P− well regions to a depth of about 1 micron to form heavily doped N+ regions. It is important to have the difference between the N+ depth and the P− depth (or the difference between the N+ and the special base P diffusion) be no more than $1\mu$, preferably $\frac{1}{2}\mu$. This difference is the base width of the bipolar transistor element and determines the upper frequency limit of the bipolar transistor element. The photoresistive material is then removed and the structure cleaned. For the buffer circuit 11 described above with reference to FIG. 1, the emitters, e, each occupy a surface area of about 150 square microns.

At this point in the fabrication process, the individual transistor elements that are to be connected to form the buffer circuit 11 are formed in the semiconductor structure 50. The surface of the structure is then covered by a vapor-deposited layer of silicon oxide, which is reflowed to smooth the exposed surface of the silicon oxide and ready it for formation of the desired metal conductor pattern thereon that is to interconnect the transistor elements and form the buffer circuit 11.

Prior to the formation of the desired metal conductor pattern, the surface of the structure 50 is masked to expose only the locations at which contacts to the transistor elements are to be made. The exposed locations are etched to define apertures through the silicon oxide layer 54 that expose the various gates, drains, sources, bases and emitters of the transistor elements. Aluminum is deposited in the apertures to form the contacts of the transistor elements to which conductors are connected to form the desired buffer circuit 11. Following the formation of the aluminum contacts, the photoresistive masking material is removed and the structure cleaned.

The monolithic IC buffer circuit 11 is completed by conventionally masking and etching the desired metal conductors 56 on the surface of the IC structure 50 to interconnect the contacts of the transistor elements and/or by conventionally interconnecting the contacts with conductive jumper wires 57. Usually, the monolithic IC buffer circuit structure 50 is covered by a scratch protective silicon oxide covering and connector pads for bonding to, for example, external conductive jumper wires 57, are formed on the covered structure by standard masking, etching and conductor deposition processes.

As described hereinbefore with reference to FIG. 1, a preferred embodiment of the buffer circuit 11 of the present invention employs bipolar transistor elements 12 and 13 arranged in a common collector circuit configuration. This enables the fabrication of a monolithic IC buffer circuit structure 50 without the need of collector isolation diffusions, which uses the heavily doped N-type substrate 51 is a common collector for all bipolar transistor elements. In such structures, a conductive pad 58 is deposited on the N+ substrate 51 for coupling the common collectors of the bipolar transistor elements 12 and 3 to a single +V terminal provided for connecting a voltage supply to the buffer circuit 11.

While the buffer circuit 11 of the present invention has been described in detail in connection with its use in interfacing CMOS logic gates, it will be appreciated by those skilled in the art that various changes and modifications can be made in adapting the invention to such use or other different ones where it is desired to take advantage of one or more of the features of the buffer circuit. Therefore, it is intended that the scope of the invention not be limited other than by the terms of the following claims.

I claim:

1. A buffer circuit comprising at least one pair of bipolar transistors, each of said pair of bipolar transistors having emitter, collector and base regions in an emitter follower circuit configuration;

at least one pair of FET transistors for each pair of bipolar transistors and each having source, drain, and gate regions defining a conducting channel between its source and drain, one of said pair of FET transistors connected with its conducting channel in series with the emitter region of one of said pair of bipolar transistors and the other of said pair of FET transistors connected with its conducting channel in series with the emitter of the other of said pair of bipolar transistors, each FET of said pair of FET transistors respectively connected in circuit with the emitter region of the bipolar transistor so that said FET transistor is in a conduction state opposite said bipolar transistor to which it is connected upon the application of a bias voltage to the transistors and of input signals to the bases of the bipolar transistors, the gate region of each FET of said pair of FET transistors connected to the emitter region of the bipolar transistor connected in series with the conducting channel of the other FET of said pair of FET transistors; and a pair of complementary FET transistors being connectable to said bias voltage, each having source, drain, and gate regions defining a conducting channel between its source and drain, the conducting channels of said pair of complementary FET transistors serially connected so that each defines a current path extending to a common junction, said common junction connected to said base region of one transistor of said pair of bipolar transistors, the gate regions of said pair of complementary FET transistors connected together and to the base region of the other transistor of said pair of bipolar transistors.

2. A buffer circuit comprising;
a first bipolar transistor having emitter, base, and collector regions;
a first FET transistor having source, drain, and gate regions defining a conducting channel between its source and drain regions, said emitter region of said first bipolar transistor connected in series with the conducting channel of said first FET transistor to define a first junction, said first bipolar transistor and said first FET transistor being connected between a voltage supply and a potential reference with the emitter and collector regions of said first bipolar transistor and the conducting channel of said first FET transistor in series therewith;
a second bipolar transistor having emitter, base, and collector regions;
a second FET transistor having source, drain, and gate regions defining a conducting channel between its source and drain regions, said emitter region of said second bipolar transistor connected in series with the conducting channel of said second FET transistor to define a second junction, said second bipolar transistor and said second FET transistor being connected between said voltage supply and said potential reference with the emitter and collector regions of said second bipolar transistor and the conducting channel of said second FET transistor in series therewith, said gate region of said first FET transistor connected to said second junction and said gate region of said second FET transistor connected to said first junction;

two complementary FET transistors each having source, drain, and gate regions defining a conducting channel between its source and drain regions, the conducting channel of one FET of the complementary FET transistors coupled between a third junction and a first terminal connectable to said voltage supply, the conducting channel of the other FET of the complementary FET transistors coupled between said third junction and a second terminal convertable to said potential reference, said third junction connected to the base region of one transistor of said bipolar transistors and the gate regions of said two complementary FET transistors connected to the base region of the other transistor of said bipolar transistor, whereby each serially connected bipolar transistor and FET transistor are maintained in opposite steady-state conduction states.

3. A buffer circuit comprising:
at least one pair of bipolar transistors, each transistor of said pair of bipolar transistors having emitter, collector and base regions;
at least one pair of FET transistors for each pair of bipolar transistors and each FET transistor having source, drain, and gate regions defining a conducting channel between its source and drain, one FET transistor of said pair of FET transistors having its conductivity channel serially connected to the emitter region of one transistor of said pair of bipolar transistors and the other FET transistor of said pair of FET transistors connected to the emitter region of the bipolar transistor connected in series with the conducting channel of the other FET transistor of said pair of FET transistors, each bipolar transistor and serially connected FET transistor being connectable between said voltage supply and said potential reference and of a conductivity type wherein the emitter of said bipolar transistor is of the same conductivity type as the channel of said serially connected FET transistor, and
a pair of complementary FET transistors, each FET transistor having source, drain, and gate regions defining a conducting channel between its source and drain, the conducting channels of said pair of complementary FET transistors being serially connected together to define a common junction, the serially connected complementary FET transistors being connectable between said voltage supply and said potential reference so that one of said pair of complementary FET transistors is of channel conductivity type opposite to that of the other of said pair of complementary FET transistors, said common junction being connected to the base region of one of said pair of bipolar transistors, and the gate regions of said pair of complementary FET transistors being connected together and to the base region of the other of said pair of bipolar transistors.

4. The buffer circuit of claim 3 wherein the bipolar transistors of each pair are of the same conductivity type, and the FET transistors of each pair having their respective conducting channels serially connected to the emitter regions of said bipolar transistors are of the same conductivity type as said serially connected bipolar transistors.

5. The buffer circuit of claim 4 wherein the FET transistors are MOSFET transistors.

6. The buffer circuit of claim 5 wherein the bipolar transistors are NPN type bipolar transistors and the MOSFET transistors having their conducting channels serially connected to the emitters of the bipolar transistors are N-channel type MOSFET transistors.

7. The buffer circuit of claim 6 wherein the emitter of each bipolar transistor is connected to the drain of its serially connected MOSFET transistor, and the drains of the complementary MOSFET transistors are connected together to define the common junction.

8. The buffer circuit of claim 5 wherein each of the complementary MOSFET transistors has an input gate capacitance of less than about 0.2 picofarad, each of the bipolar transistors has an output impedance that is less than about 1/5 the on conducting channel resistance of the MOSFET transistor having its conducting channel serially connected to the emitter of said bipolar transistor.

9. The buffer circuit of claim 3 wherein the connected gate regions of the pair of complementary FET transistors are connected to an input terminal for receiving input signals, and at least one of the emitters of the pair of bipolar transistors is connected to an output terminal for providing output bufter signals.

10. The buffer circuit of claims 9 further comprising a signal source coupled to the input terminal and at least one signal utilization device coupled to the output terminal.

11. The buffer circuit of claim 10 wherein the signal source is a first CFET logic gate, and the signal utilization device is a second CFET logic gate.

12. The buffer circuit of claim 11 wherein both emitters of the pair of bipolar transistors are coupled to a pair of output terminals for providing output buffer signals which are the complement of each other, and each of said pair of output terminals is coupled to the CFET logic gate forming a signal utilization device.

13. The buffer circuit of either claim 11 or claim 12 wherein the FET transistors are MOSFET transistors, and the CFET logic gates are CMOS type CFET logic gates.

14. The buffer circuit of claim 10 further comprising a voltage supply means coupled in circuit with the transistors of the buffer circuit for providing operating power thereto.

* * * * *